(12) United States Patent
Aoyama et al.

(10) Patent No.: US 8,053,825 B2
(45) Date of Patent: Nov. 8, 2011

(54) STACKED GATE NONVOLATILE SEMICONDUCTOR MEMORY AND METHOD FOR MANUFACTURING THE SAME

(75) Inventors: Kenji Aoyama, Yokohama (JP); Satoshi Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 855 days.

(21) Appl. No.: 11/927,799

(22) Filed: Oct. 30, 2007

(65) Prior Publication Data

US 2008/0185630 A1    Aug. 7, 2008

(30) Foreign Application Priority Data

Feb. 6, 2007  (JP) ................ P2007-026868

(51) Int. Cl.
*H01L 29/788* (2006.01)
(52) U.S. Cl. .................... 257/316; 257/315
(58) Field of Classification Search .............. 257/316, 257/315
See application file for complete search history.

(56) References Cited

U.S. PATENT DOCUMENTS

| 6,396,101 | B2 | 5/2002 | Patelmo et al. |
| 6,720,579 | B2 | 4/2004 | Shin et al. |
| 7,582,927 | B2 * | 9/2009 | Isobe et al. .......... 257/314 |
| 2006/0244018 | A1 | 11/2006 | Kutsukake et al. |

FOREIGN PATENT DOCUMENTS

JP   2006-310454   11/2006

* cited by examiner

*Primary Examiner* — Douglas Menz
(74) *Attorney, Agent, or Firm* — Finnegan, Henderson, Farabow, Garrett & Dunner, L.L.P.

(57) ABSTRACT

A stacked gate nonvolatile semiconductor memory includes at least a memory cell transistor and a selective gate transistor which are formed on a semiconductor substrate. The memory cell transistor includes a floating gate made of a semiconductor material below an interlayer insulating layer and a control gate made of a silicide above the interlayer insulating layer. The selective gate transistor includes a semiconductor layer made of the semiconductor material, a silicide layer made of the silicide and a conductive layer made of a conductive material not subject to silicide process which is formed through the interlayer insulating film so as to electrically connect the semiconductor layer and the silicide layer.

3 Claims, 7 Drawing Sheets

STACKED GATE NONVOLATILE SEMICONDUCTOR MEMORY AND METHOD FOR MANUFACTURING THE SAME

CROSS-REFERENCE TO RELATED APPLICATIONS

This application is based upon and claims the benefit of priority from the prior Japanese Patent Application No. 2007-026868 filed on Feb. 6, 2007; the entire contents which are incorporated herein by reference.

BACKGROUND OF THE INVENTION

1. Field of the Invention

The present invention relates to a stacked gate nonvolatile semiconductor memory and a method for manufacturing the stack gate nonvolatile semiconductor memory.

2. Description of the Related Art

As one of nonvolatile semiconductor memories, a NAND flush memory is well known. With the NAND flush memory, a plurality of memory cell transistors and a plurality of selective gate transistors are provided and in addition, the peripheral circuitry is provided so as to operate the NAND flush memory. The memory cell transistors, the selective gate transistors and the peripheral circuitry are formed on a given semiconductor substrate. Each memory cell transistor includes a floating gate made of a first semiconductor material such as polysilicon and a control gate made of a second semiconductor material such as polysilicon which is formed on the floating gate via an interlayer insulating layer.

Each selective gate transistor can be formed in the same manner as the memory cell transistor. Namely, the selective gate transistors and the memory cell transistors are formed simultaneously. In this case, each selective gate transistor is configured such that a first semiconductor layer made of the first semiconductor material and a second semiconductor layer made of the second semiconductor material are stacked via the interlayer insulating film. In this point of view, the NAND flush memory is structured as a stacked gate nonvolatile semiconductor memory.

With the stacked gate nonvolatile semiconductor memory, particularly, the second semiconductor material constituting the control gate of the memory cell transistor is silicified so as to reduce the resistance of the control gate and thus, reduce the contact resistance for a contact plug. In this case, the operation voltage of the nonvolatile semiconductor memory can be reduced and the operationality of the nonvolatile semiconductor memory can be enhanced (refer to Reference 1).

In the stack gate nonvolatile semiconductor memory, in contrast, the selective gate transistor functions only as a transistor, not a memory. As described above, if the selective gate transistor is made of the first semiconductor layer and the second semiconductor layer via the interlayer insulating film in accordance with the formation of the memory cell transistor as it is, the selective gate transistor can not exhibit the inherent function because the first semiconductor layer and the second semiconductor layer is electrically separated from one another via the interlayer insulating film. In this point of view, it is required to form a conductive layer so as to penetrate through the interlayer insulating film.

Generally, the conductive layer composing the selective gate transistor is made of a silicide through the silicide process for the control gate of the memory cell transistor. In the silicide process for the conductive layer, the intended silicide is formed too deep into the first semiconductor layer not to maintain the stable transistor operation originated from the change in operation performance of the selective gate transistor such as threshold value.

[Reference 1] JP-A 2006-310454 (KOKAI)

BRIEF SUMMARY OF THE INVENTION

An aspect of the present invention relates to a stacked gate nonvolatile semiconductor memory including at least a memory cell transistor and a selective gate transistor which are formed on a semiconductor substrate; wherein the memory cell transistor includes a floating gate made of a semiconductor material below an interlayer insulating layer and a control gate made of a silicide above the interlayer insulating layer; wherein the selective gate transistor includes a semiconductor layer made of the semiconductor material, a silicide layer made of the silicide and a conductive layer made of a conductive material not subject to silicide process which is formed through the interlayer insulating film so as to electrically connect the semiconductor layer and the silicide layer.

Another aspect of the present invention relates to a stacked gate nonvolatile semiconductor memory including at least a memory cell transistor and a selective gate transistor which are formed on a semiconductor substrate; wherein the memory cell transistor includes a floating gate made of a semiconductor material below an interlayer insulating layer and a control gate made of a silicide above the interlayer insulating layer; wherein the selective gate transistor includes a semiconductor layer made of the semiconductor material, a silicide layer made of the silicide and a silicide conductive layer made of an additional silicide material which is formed through the interlayer insulating film so as to electrically connect the semiconductor layer and the silicide layer.

Still another aspect of the present invention relates to a stacked gate nonvolatile semiconductor memory including at least a memory cell transistor and a selective gate transistor which are formed on a semiconductor substrate; wherein the memory cell transistor includes a floating gate made of a semiconductor material below an interlayer insulating layer and a control gate made of a silicide above the interlayer insulating layer; wherein the selective gate transistor includes a semiconductor layer made of the semiconductor material and a conductive layer made of a conductive material not subject to silicide process which is formed on the semiconductor layer.

A further aspect of the present invention relates to a stacked gate nonvolatile semiconductor memory including at least a memory cell transistor and a selective gate transistor which are formed on a semiconductor substrate; wherein the memory cell transistor includes a floating gate made of a semiconductor material below an interlayer insulating layer and a control gate made of a silicide above the interlayer insulating layer; wherein the selective gate transistor includes a semiconductor layer made of the semiconductor material and a silicide conductive layer made of an additional silicide material.

A still further aspect of the present invention relates to a method for manufacturing a stacked gate nonvolatile semiconductor memory, including: forming, on a semiconductor substrate, a memory cell transistor including a floating gate made of a semiconductor material located below an interlayer insulating film and a control gate made of a silicide located above the interlayer insulating film; subsequently forming a semiconductor layer of the semiconductor material and a silicide layer of the silicide via the interlayer insulating film, and partially removing at least the semiconductor layer and the interlayer insulating film to form an opening, and forming a conductive layer made of a conductive material not subject to silicide process in the opening to form a selective gate transistor.

Still another aspect of the present invention relates to a method for manufacturing a stacked gate nonvolatile semiconductor memory, including: forming, on a semiconductor substrate, a memory cell transistor including a floating gate made of a semiconductor material located below an interlayer insulating film and a control gate made of a silicide located above the interlayer insulating film; and subsequently forming a semiconductor layer of the semiconductor material and a silicide layer of the silicide via the interlayer insulating film, and partially removing at least the semiconductor layer and the interlayer insulating film to form an opening, and forming a silicide conductive layer made of an additional silicide in the opening to form a selective gate transistor.

A further aspect of the present invention relates to a method for manufacturing a stacked gate nonvolatile semiconductor memory, including: forming, on a semiconductor substrate, a memory cell transistor including a floating gate made of a semiconductor material located below an interlayer insulating film and a control gate made of a silicide located above the interlayer insulating film; and subsequently forming a semiconductor layer of the semiconductor material and a pre-semiconductor layer via interlayer insulating film, and removing the pre-semiconductor layer, the interlayer insulating film and a portion of the semiconductor layer in the stacking direction thereof, and forming, on the remaining semiconductor layer, a conductive layer made of a conductive material not subject to silicide process to form a selective gate transistor.

A still further aspect of the present invention relates to a method for manufacturing a stacked gate nonvolatile semiconductor memory, including: forming, on a semiconductor substrate, a memory cell transistor including a floating gate made of a semiconductor material located below an interlayer insulating film and a control gate made of a silicide located above the interlayer insulating film; and subsequently forming a semiconductor layer of the semiconductor material and a pre-semiconductor layer via interlayer insulating film, and removing the pre-semiconductor layer, the interlayer insulating film and a portion of the semiconductor layer in the stacking direction thereof, and forming, on the remaining semiconductor layer, a silicide conductive layer made of an additional silicide to form a selective gate transistor.

DETAILED DESCRIPTION OF THE INVENTION

Then, some embodiments will be described with reference to the drawings.

First Embodiment

Figure 1:
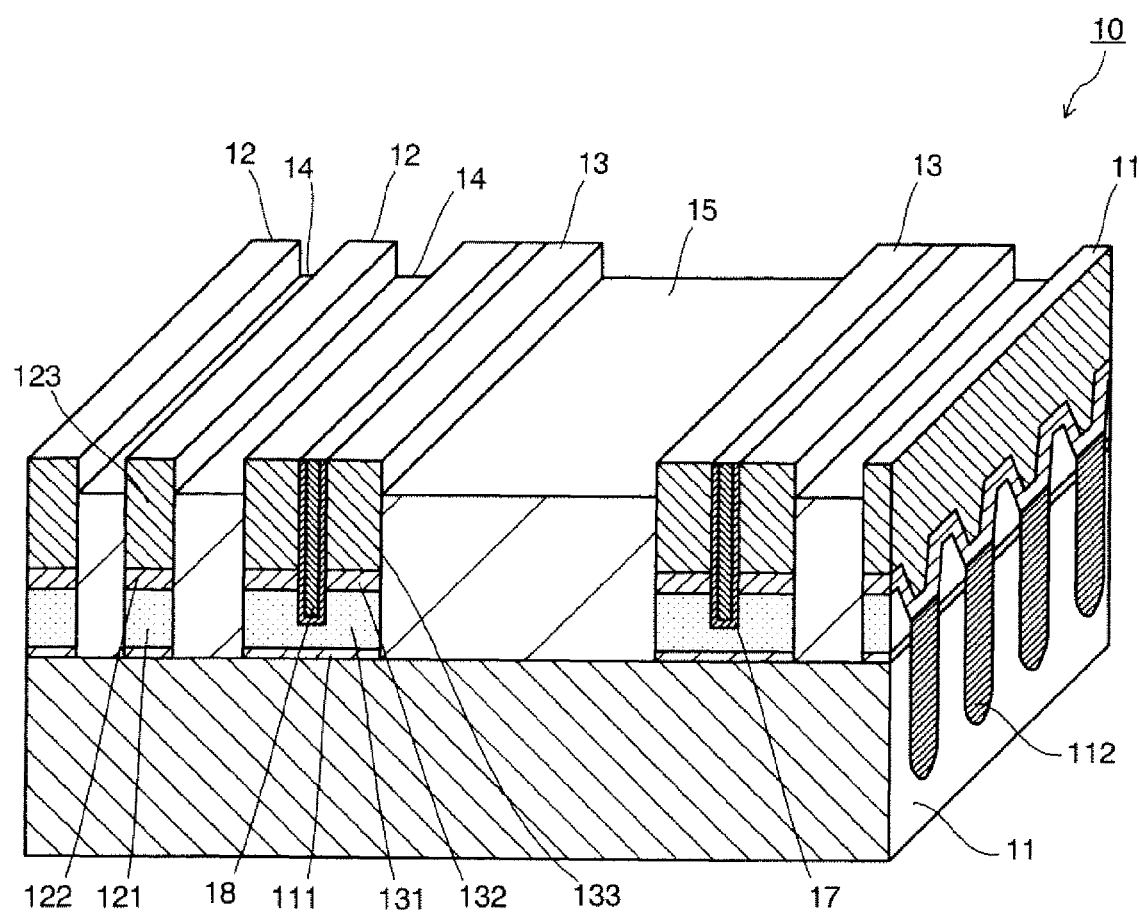
FIG. 1 is a perspective view schematically showing an essential part of a stacked gate nonvolatile semiconductor memory according to a first embodiment.
Figure 2:
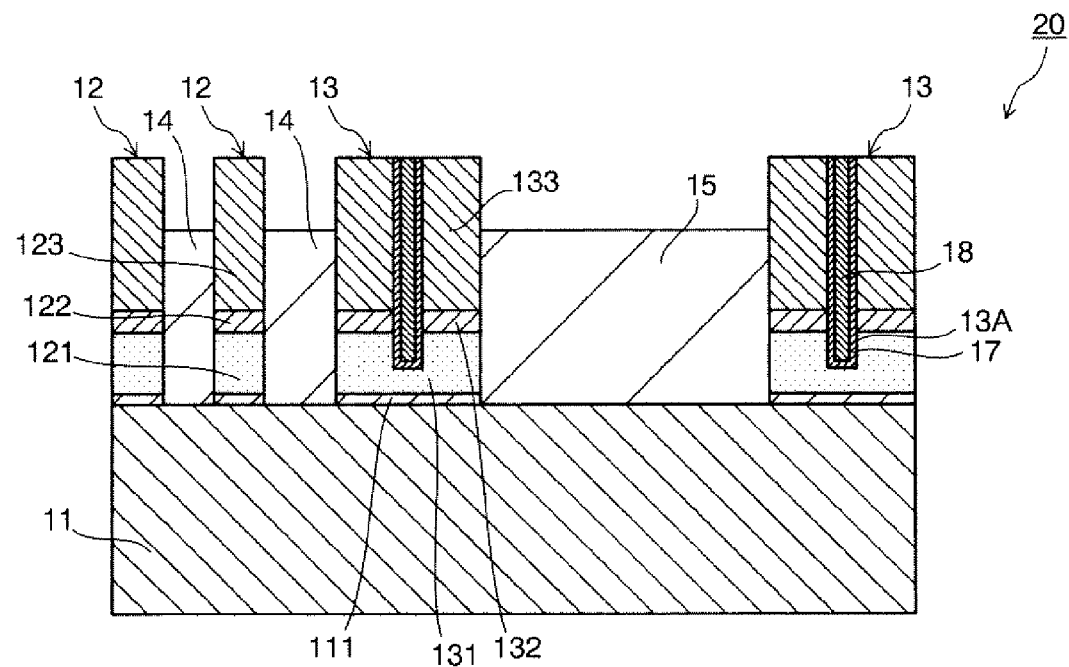
FIG. 2 is a cross sectional view of the stacked gate nonvolatile semiconductor memory shown in FIG. 1, as viewed from the direction designated by the arrow "A".

FIG. 1 is a perspective view schematically showing an essential part of a stacked gate nonvolatile semiconductor memory according to a first embodiment. FIG. 2 is a cross sectional view of the stacked gate nonvolatile semiconductor memory shown in FIG. 1, as viewed from the direction designated by the arrow "A". For clarifying the distinctive feature of the present embodiment, some components may be different from the real ones in size and the like.

As shown in FIGS. 1 and 2, in the stacked gate nonvolatile semiconductor memory 10 of this embodiment, a plurality of memory cell transistors 12 and a plurality of selective gate transistors 13 are provided on a semiconductor substrate 11 made of, e.g., Si via corresponding tunnel insulating films 111. The memory cell transistors 12 are separated from one another via corresponding element isolation insulating films 14. Then, each memory cell transistor 12 and each selective gate transistor 13 are also separated from one another via corresponding element isolation insulating film 14. Then, the adjacent selective gate transistors 13 are separated from one another via corresponding element isolation insulating film 15. The tunnel insulating film 111 may be made of a silicon oxynitride film with a thickness of 85 nm. However, the thickness of the silicon oxynitride film is exemplified in the present technological level of the nonvolatile semiconductor memory, but may be varied in accordance with the development of the technological level of the nonvolatile semiconductor memory.

The element isolation insulating films 14 and 15 may be formed in various structures commensurate with the manufacturing process of the nonvolatile semiconductor memory 10 and in view of the development in characteristic of the nonvolatile semiconductor memory 10. In this embodiment, the detail description relating to the element isolation insulating films 14 and 15 will be omitted for convenience so that the element isolation insulating films 14 and 15 are considered as single layers, respectively.

The memory cell transistor 12 includes a floating gate 121 made of, e.g., phosphor-doped silicon (P-doped Si), an interlayer insulating film 122 and a control gate 123 made of silicide from the bottom to the top thereof. The interlayer insulating film 122 may be made of an NONON film of silicon (N: nitrogen, O: oxygen). The thickness of the interlayer insulating film 122 may be set to 85 nm. Since the control gate 123 is made of the silicide which is formed by reacting a Ni, NiPt or Co film with a silicon film, the resistance of the control gate 123 is reduced in comparison with a control gate made of polysilicon.

The selective gate transistor 13 includes a semiconductor layer 131 made of the same semiconductor material such as phosphor-doped silicon (P-doped Si), an interlayer insulating film 132 and a silicide layer 133 from the bottom to the top thereof. The interlayer insulating film 132 may be formed in the same structure as the interlayer insulating film 122 originated from the manufacturing method of the nonvolatile semiconductor memory 10. Then, a conductive layer 18 is formed from the top of the silicide layer 133 into the semiconductor layer 131 through the interlayer insulating film 132 so as to embed the opening 13A formed at the silicide layer 133. The conductive layer 18 is made of a material not to be reacted with silicon (Si) such as tungsten (W). Then, a barrier film 17 is formed of titanium (Ti) or titanium nitride (TiN) on the inner wall of each opening 13A so that the conductive layer 18 is not contacted directly with the silicide layer 133.

With the selective gate transistor 13, the semiconductor layer 131 and the silicide layer 133 are electrically connected with the conductive layer 18 via the interlayer insulating film 132. As a result, the selective gate transistor 13 can exhibit the inherent performance as it is. Then, in the annealing process to silicify the floating gate 123 in the memory cell transistor 12, the conductive layer 18 can not be reacted with silicon (Si) so as not to be converted into the corresponding silicide layer. In the selective gate transistor 13, therefore, since the area in the vicinity of the semiconductor substrate 11 is not made of the silicide, various characteristics of the selective gate transistor 13 such as threshold value can be maintained as they are because the silicide can not affect the selective gate transistor 13. The annealing process for forming the silicide floating gate 123 will be described in detail hereinafter.

With the memory cell transistor 12, the floating gate 121 is located below the interlayer insulating layer 122 and the control gate 123 is located above the interlayer insulating layer 122 so as to exhibit the inherent function as a memory cell. Since the control gate 123 is made of silicide, the contact resistance of the control gate 123 for a contact plug or the like can be reduced. As a result, the nonvolatile semiconductor memory 10 can be operated stably under the condition that the operational voltage is reduced on the stable operation of the selective gate transistor 13.

The conductive layer 18 may be made of TiN, aluminum (Al) and copper (Cu) in addition to W as described above. These materials are unlikely to be reacted with silicon (Si) so as not to form the corresponding silicide.

Figure 3:
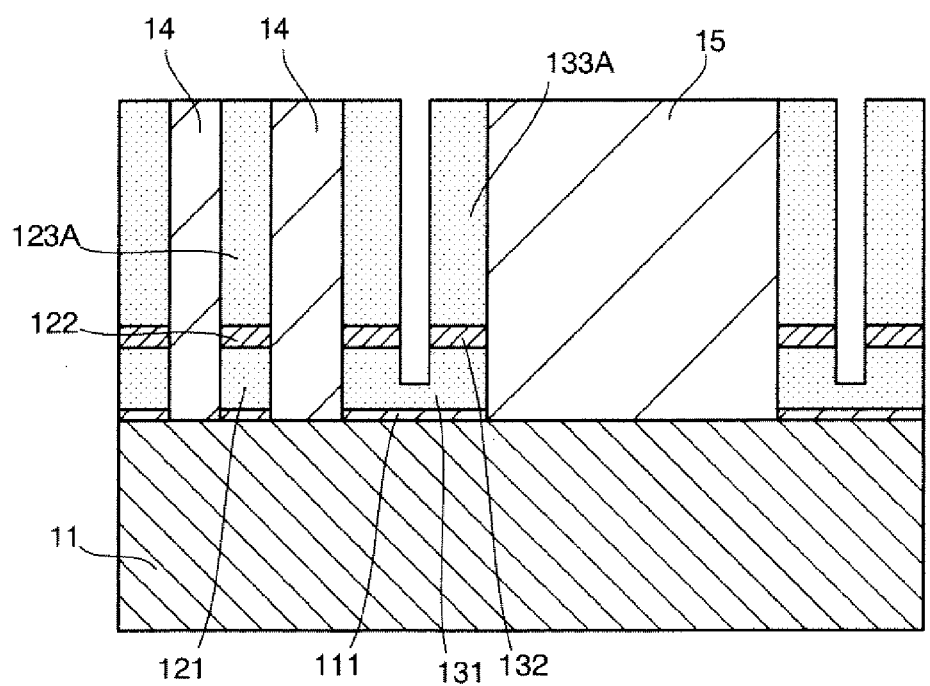
FIG. 3 is a cross sectional view showing a step in a method for manufacturing the stacked gate nonvolatile semiconductor memory in the first embodiment (third embodiment).

Then, a method for manufacturing the stacked gate nonvolatile semiconductor memory will be described. FIGS. 3 to 6 are cross sectional views relating to the manufacturing method of the nonvolatile semiconductor memory. In the manufacturing method of this embodiment, attention is paid to a part relating to one memory unit of the nonvolatile semiconductor memory. First of all, as shown in FIG. 3, the semiconductor substrate 11 is prepared as a Si substrate, and the tunnel insulating film 111 is formed of silicon oxynitride or the like on the semiconductor substrate 11 by means of oxynitriding treatment for the surface of the semiconductor substrate 11. Then, the semiconductor layers 121; 131, the interlayer insulating films 122; 123 and the pre-semiconductor layers 123A; 133A are formed on the semiconductor substrate 11 via the tunnel insulating film 111. The semiconductor layers 121 and 131 are made of the first semiconductor material such as phosphor-doped silicon (P-doped Si). The pre-semiconductor layers 123A and 133A are also made of, e.g., phosphor-doped silicon (P-doped Si). The semiconductor layers and the pre-semiconductor layers are formed by means of normal film forming technique such as chemical vapor deposition (CVD).

Then, a prescribed etching treatment is carried out for the thus obtained laminated structure via a mask to form some openings. Then, the element isolation insulating films 14 and 15 are formed into the openings. The element isolation insulating films 14 insulate the adjacent memory cell transistors 12, and the memory cell transistor 12 and the selective gate transistor 13 adjacent to the memory cell transistor 12 as described above. The element isolation insulating films 15 insulate the adjacent selective gate transistors 13 to be formed later.

Figure 4:
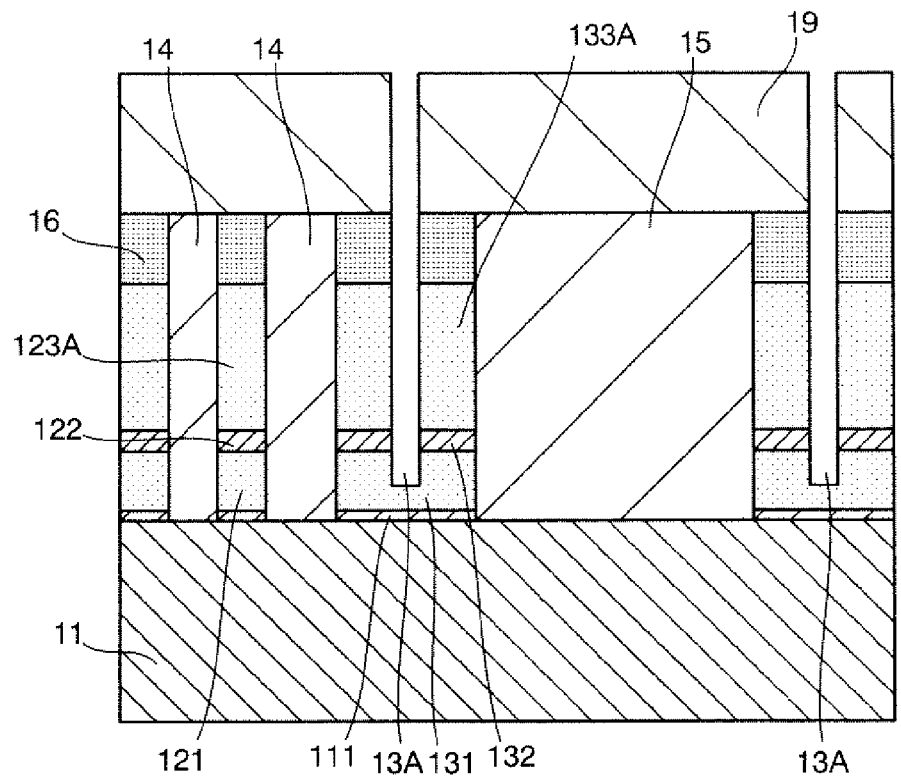
FIG. 4 is a cross sectional view showing another step in a method for manufacturing the stacked gate nonvolatile semiconductor memory in the first embodiment.

Then, as shown in FIG. 4, the pre-semiconductor layers 123A and 133A are nitrided to form the silicon nitride films 16. Then, a predetermined resist pattern 19 is formed on the silicon nitride 16 and a dry etching process is carried out so that the openings 13A are formed at the laminated structure formed by the step shown in FIG. 3 in the thickness direction of the laminated structure. In this case, the openings 13A are formed from the pre-semiconductor layers 133A to the semiconductor layers 131 through the interlayer insulating layers 132.

Figure 5:
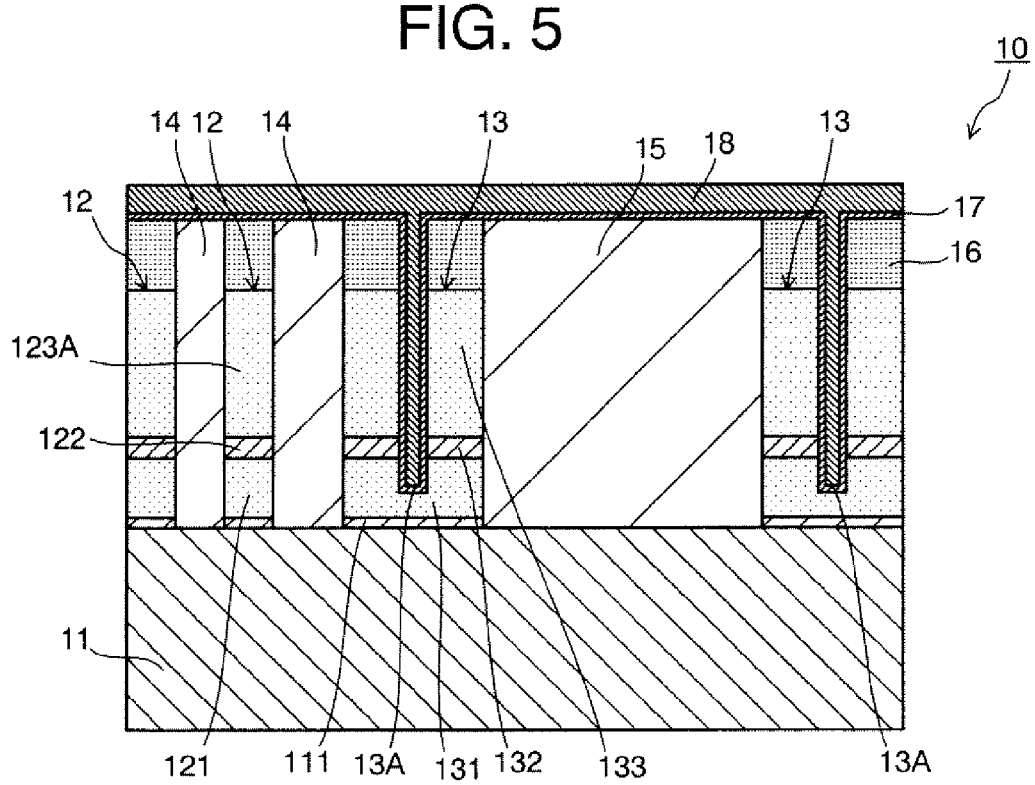
FIG. 5 is a cross sectional view showing still another step in a method for manufacturing the stacked gate nonvolatile semiconductor memory in the first embodiment.
Figure 6:
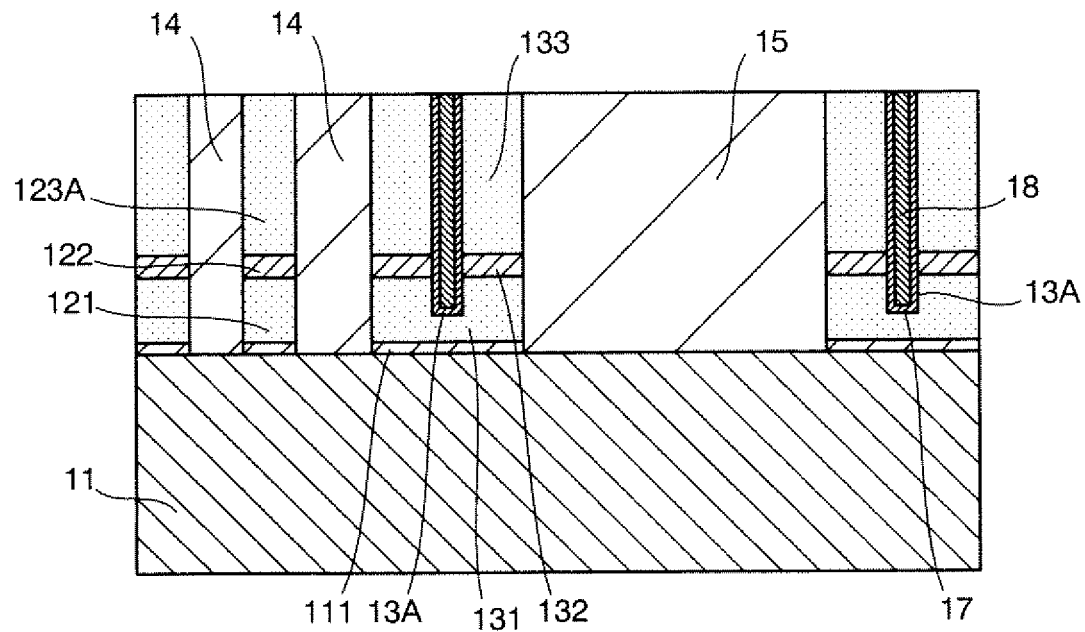
FIG. 6 is a cross sectional view showing a further step in a method for manufacturing the stacked gate nonvolatile semiconductor memory in the first embodiment.

Then, as shown in FIG. 5, the resist pattern 19 is removed by means of ashing, and then, the barrier films 17 are formed of titanium (Ti), titanium nitride (TiN) or the like over the laminated structure formed by the step shown in FIG. 4 so as to be also formed on the inner wall of the openings 13A by mean of sputtering. Then, the conductive layers 18 are formed of tungsten (W) or the like on the conductive layer 17 so as to embed the openings 13A by means of chemical vapor deposition (CVD) or the like. Then, as shown in FIG. 6, portions of the conductive layers 18 and the barrier film 17 remaining on the laminated structure are etched and removed, and then, a film (not shown) made of platinum (Pt), nickel-platinum (NiPt) or cobalt (Co) is formed on the laminated structure. Then, a predetermined annealing treatment is carried out for the film by means of lamp heating so that the constituent elements of the film such as nickel elements can be diffused into the pre-semiconductor layers 123A and 133A, thereby forming the respective silicide layers.

As a result, in the memory cell transistor 12, the silicide layer functions as the control gate, and in the selective gate transistor 13, the silicide layer 133 is electrically connected with the semiconductor layer 131 via the conductive layer 18 so that the selective gate transistor 13 can operate as a single transistor as described in FIGS. 1 and 2.

Second Embodiment

Figure 7:
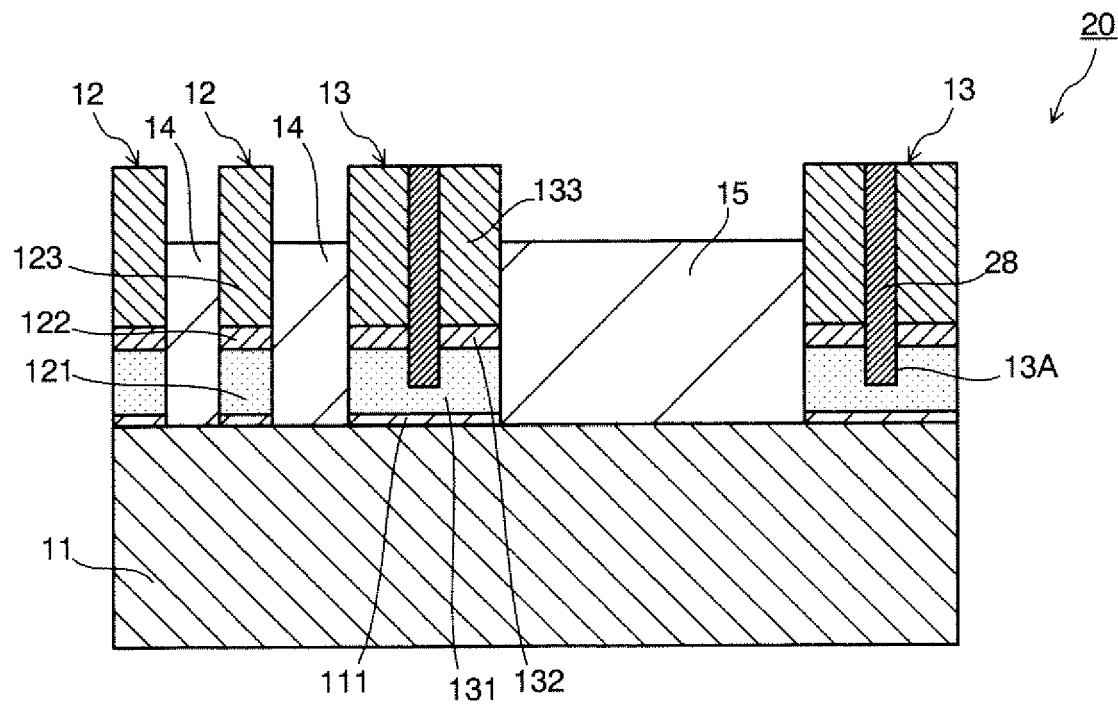
FIG. 7 is a perspective view schematically showing an essential part of a stacked gate nonvolatile semiconductor memory according to a second embodiment.

FIG. 7 is a perspective view schematically showing an essential part of a stacked gate nonvolatile semiconductor memory according to a second embodiment. For clarifying the distinctive feature of the present embodiment, some components may be different from the real ones in size and the like. Moreover, like or corresponding components may be designated by the same reference numerals throughout the drawings.

As shown in FIG. 7, the stacked gate nonvolatile semiconductor memory 20 in this embodiment is different from the one in the first embodiment in that the semiconductor layer 131 and the silicide layer 133 are electrically connected with one another directly via the silicide conductive layer 28, instead of the conductive layer 18 not made of silicide, through the interlayer insulating film 132 so that the selective gate transistor 13 can function as a single transistor.

In this embodiment, since the semiconductor layer 131 and the silicide layer 133 are electrically connected with one another by the silicide conductive layer 28, the silicide conductive layer 28 can not be reacted with silicon at the annealing process for silicifying the floating gate 123 in the memory cell transistor 12. As a result, there is not such a disadvantage as the area in the vicinity of the semiconductor substrate 11 is made of silicide to deteriorate some characteristics such as threshold value of the selective gate transistor 13.

The silicide conductive layer 28 can exhibit the inherent barrier performance to some degrees. As is apparent from FIG. 7, therefore, no barrier film made of titanium (Ti) or the like is required to be formed so that the manufacturing process of the nonvolatile semiconductor memory 20 can be simplified.

In this embodiment, the conductive layer 28 may be made of tungsten silicide (WSi), cobalt silicide (CoSi), titanium silicide (TiSi$_2$) and the like.

The nonvolatile semiconductor memory 20 can be manufactured in the same manner as the nonvolatile semiconductor memory 10 in the first embodiment except that the corresponding conductive layers are different from one another and whether the barrier film is formed or not.

The silicide conductive layer 28 may be formed by means of chemical vapor deposition (CVD) using (a) prescribed raw material gas(es). In the case of the formation of the WSi conductive layer 48, for example, a WF$_6$ raw material gas and a SiH$_2$Cl$_2$ (dichlorosilane) raw material gas are employed.

Third Embodiment

Figure 8:
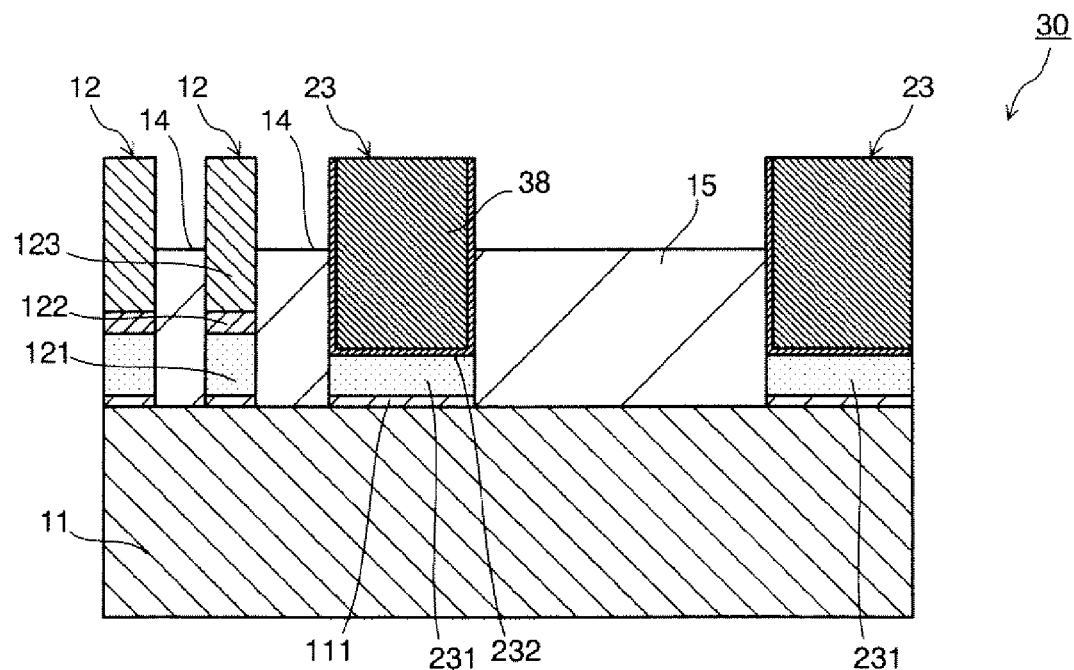
FIG. 8 is a perspective view schematically showing an essential part of a stacked gate nonvolatile semiconductor memory according to a third embodiment.

FIG. 8 is a perspective view schematically showing an essential part of a stacked gate nonvolatile semiconductor memory according to a third embodiment. For clarifying the distinctive feature of the present embodiment, some components may be different from the real ones in size and the like. Moreover, like or corresponding components may be designated by the same reference numerals throughout the drawings. In this embodiment, attention is paid to a part relating to one memory unit of the nonvolatile semiconductor memory.

As shown in FIG. 8, in the stacked gate nonvolatile semiconductor memory 30 of this embodiment, a plurality of memory cell transistors 12 and a plurality of selective gate transistors 13 are provided on a semiconductor substrate 11 made of, e.g., Si via corresponding tunnel insulating films 111. The memory cell transistors 12 are separated from one another via corresponding element isolation insulating films 14. Then, each memory cell transistor 12 and each selective gate transistor 13 are also separated from one another via corresponding element isolation insulating film 14. Then, the adjacent selective gate transistors 13 are separated from one another via corresponding element isolation insulating films 15. The tunnel insulating film 111 may be made of a silicon oxynitride film with a thickness of 85 nm. However, the thickness of the silicon oxynitride film is exemplified in the present technological level of the nonvolatile semiconductor memory, but may be varied in accordance with the development of the technological level of the nonvolatile semiconductor memory.

The element isolation insulating films 14 and 15 may be formed in various structures commensurate with the manufacturing process of the nonvolatile semiconductor memory 30 and in view of the development in characteristic of the nonvolatile semiconductor memory 30. In this embodiment, the detail description relating to the element isolation insulating films 14 and 15 will be omitted for convenience so that the element isolation insulating films 14 and 15 are considered as single layers, respectively.

The memory cell transistor 12 includes a floating gate 121 made of, e.g., phosphor-doped silicon (P-doped Si), an interlayer insulating film 122 and a control gate 123 made of silicide from the bottom to the top thereof. The interlayer insulating film 122 may be made of an NONON film of silicon (N: nitrogen, O: oxygen). The thickness of the interlayer insulating film 122 may be set to 85 nm. Since the control gate 123 is made of the silicide which is formed by reacting a Ni, NiPt of Co film with a silicon film, the resistance of the control gate 123 is reduced in comparison with a control gate made of polysilicon.

The selective gate transistor 23 includes a semiconductor layer 231, a barrier film 232 and a conductive layer 38 made of, e.g., tungsten (W) not subject to the silicide process. In the selective gate transistor 23, since the conductive layer 38 is formed directly on the semiconductor layer 231 via the barrier layer 232, the conductive layer 38 is electrically connected with the semiconductor layer 231. As a result, the selective gate transistor 23 can function as a single transistor. Then, in the annealing process to silicify the floating gate 123 in the memory cell transistor 12, the conductive layer 38 can not be reacted with silicon (Si) so as not to be converted into the corresponding silicide layer. In the selective gate transistor 23, therefore, since the area in the vicinity of the semiconductor substrate 11 is not made of the silicide, various characteristics of the selective gate transistor 23 such as threshold value can be maintained as they are because the silicide can not affect the selective gate transistor 23. The annealing process for forming the silicide floating gate 123 will be described in detail hereinafter.

The barrier film 232 prevents the interdiffusion between the constituent elements of the semiconductor layer 231 and the constituent elements of the conductive layer 38 and thus, the formation of the intermixed layer of the semiconductor layer 231 and the conductive layer 28.

With the memory cell transistor 12, the floating gate 121 is located below the interlayer insulating layer 122 and the control gate 123 is located above the interlayer insulating layer 122 so as to exhibit the inherent function as a memory cell. Since the control gate 123 is made of silicide, the contact resistance of the control gate 123 for a contact plug or the like can be reduced. As a result, the nonvolatile semiconductor memory 30 can be operated stably under the condition that the operational voltage is reduced on the stable operation of the selective gate transistor 23.

The conductive layer 38 may be made of TiN, aluminum (Al) and copper (Cu) in addition to W as described above. These materials are unlikely to be reacted with silicon (Si) so as not to form the corresponding silicide.

Then, a method for manufacturing the stacked gate nonvolatile semiconductor memory will be described. FIGS. 3 and 9 to 11 are cross sectional views relating to the manufacturing method of the nonvolatile semiconductor memory. First of all, as shown in FIG. 3, the semiconductor substrate 11 is prepared as a Si substrates and the tunnel insulating film 111 is formed of silicon oxynitride or the like on the semiconductor substrate 11 by means of oxynitriding treatment for the surface of the semiconductor substrate 11. Then, the semiconductor layers 121; 131, the interlayer insulating films 122; 123 and the pre-semiconductor layers 123A; 133A are formed on the semiconductor substrate 11 via the tunnel insulating film 111. The semiconductor layers 121 and 131 are made of the first semiconductor material such as phosphor-doped silicon (P-doped Si). The pre-semiconductor layers 123A and 133A are also made of, e.g., phosphor-doped silicon (P-doped Si). The semiconductor layers and the pre-semiconductor layers are formed by means of normal film forming technique such as chemical vapor deposition (CVD).

Then, a prescribed etching treatment is carried out for the thus obtained laminated structure via a mask to form some openings. Then, the element isolation insulating films 14 and 15 are formed into the openings. The element isolation insulating films 14 insulate the adjacent memory cell transistors 12, and the memory cell transistor 12 and the selective gate transistor 23 adjacent to the memory cell transistor 12 as described above. The element isolation insulating films 15 insulate the adjacent selective gate transistors 23 to be formed later.

Figure 9:
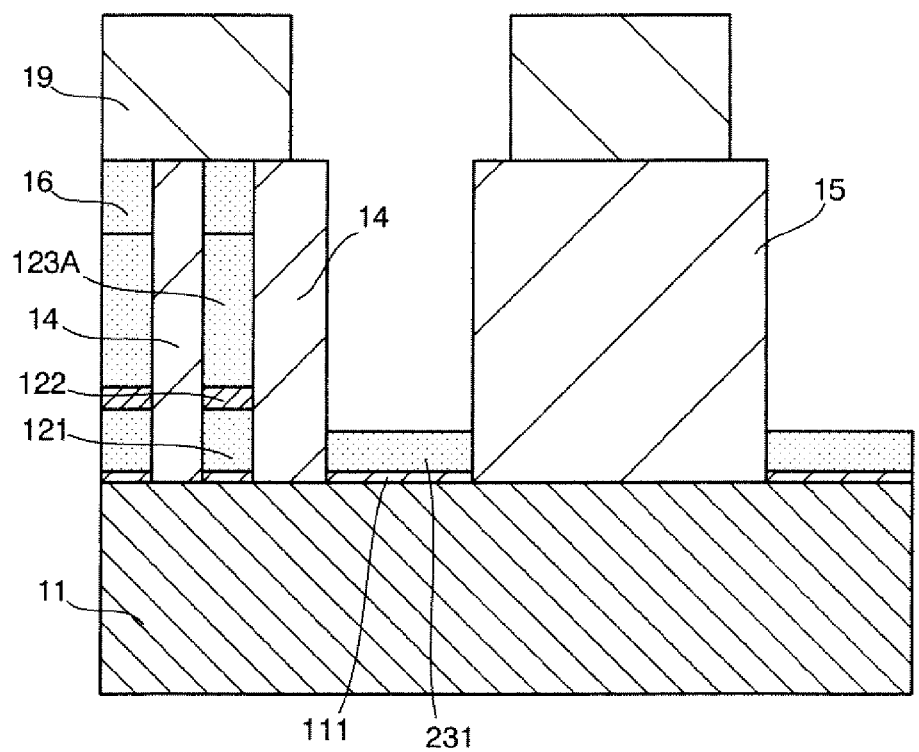
FIG. 9 is a cross sectional view showing another step in a method for manufacturing the stacked gate nonvolatile semiconductor memory in the third embodiment.

Then, as shown in FIG. 9, the pre-semiconductor layers 123A and 133A are nitrided to form the silicon nitride films 16. Then, a predetermined resist pattern 19 is formed on the silicon nitride 16 and a dry etching process is carried out via the resist pattern 19 so that an area for the selective gate transistor 13 to be formed can be formed by partially removing the pre-semiconductor layer 133A, the interlayer insulating film 132 and the semiconductor layer 131 in the thickness direction of the laminated structure.

Figure 10:
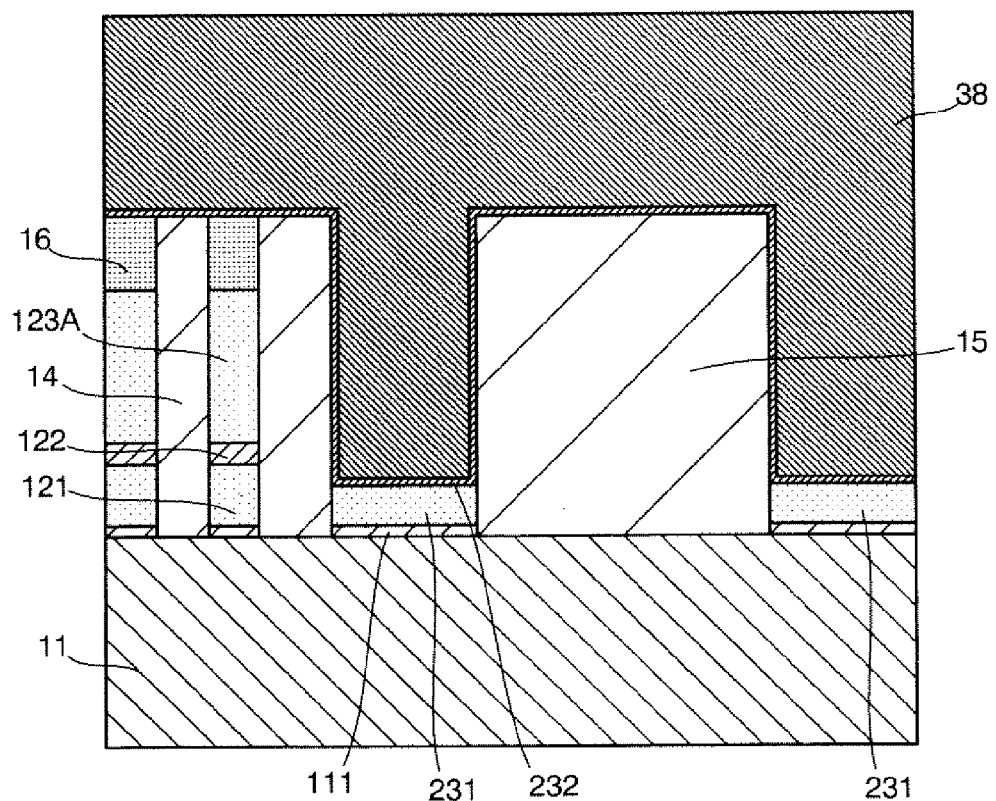
FIG. 10 is a cross sectional view showing still another step in a method for manufacturing the stacked gate nonvolatile semiconductor memory in the third embodiment.
Figure 11:
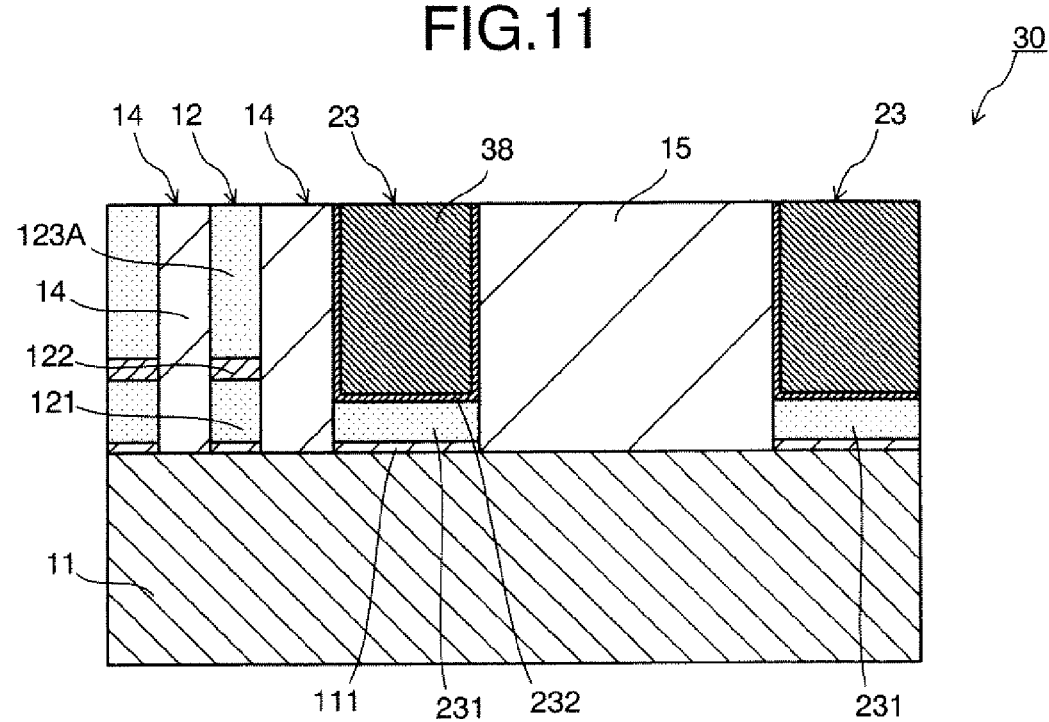
FIG. 11 is a cross sectional view showing a further step in a method for manufacturing the stacked gate nonvolatile semiconductor memory in the third embodiment.

Then, as shown in FIG. 10, the resist pattern 19 is removed by means of ashing, and then, the barrier layer 232 is formed of titanium (Ti), titanium nitride (TiN) or the like over the laminated structure. Then, the conductive layer 38 is formed over the laminated structure so as to embed the area for forming the selective gate transistor 13 by means of chemical vapor deposition (CVD). Then, as shown in FIG. 11, portions of the conductive layers 38 and the barrier layer 23 remaining on the laminated structure are etched and removed, and then, a film (not shown) made of platinum (Pt), nickel-platinum (NiPt) or cobalt (Co) is formed on the laminated structure. Then, a predetermined annealing treatment is carried out for the film by means of lamp heating so that the constituent elements of the film such as nickel elements can be diffused into the pre-semiconductor layer 123A, thereby forming the corresponding silicide layer. As a result, in the memory cell transistor 12, the silicide layer functions as the control gate 123.

Figure 12:
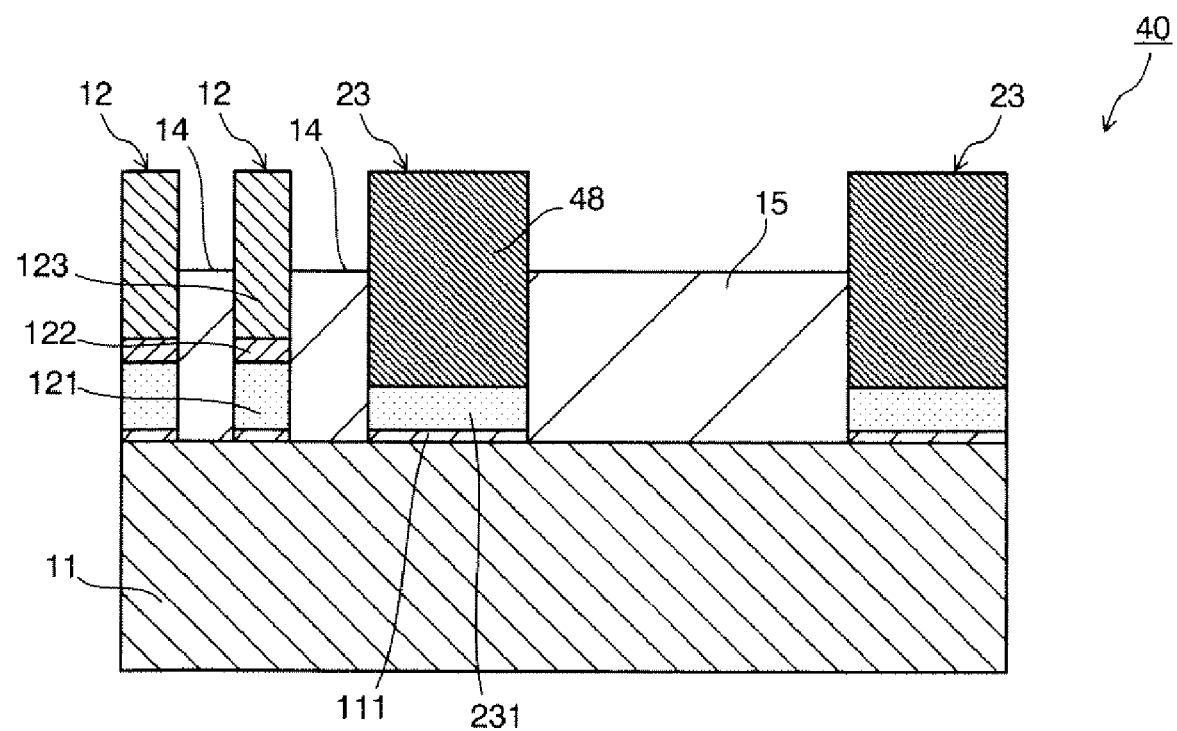
FIG. 12 is a perspective view schematically showing an essential part of a stacked gate nonvolatile semiconductor memory according to a fourth embodiment.

In the selective gate transistor 23, the conductive layer 38 is not subject to the silicide process so as to be electrically connected with the semiconductor layer 231 via the barrier layer 232. As a result, the selective gate transistor 23 can function Fourth Embodiment FIG. 12 is a perspective view schematically showing an essential part of a stacked gate nonvolatile semiconductor memory according to a fourth embodiment. For clarifying the distinctive feature of the present embodiment, some components may be different from the real ones in size and the like. Moreover, like or corresponding components may be designated by the same reference numerals throughout the drawings.

As shown in FIG. 12, the stacked gate nonvolatile semiconductor memory 40 in this embodiment is different from the one in the third embodiment in that the selective gate transistor 23 includes a silicide conductive layer 48, instead of the conductive layer 38, so as to function as a single transistor.

In this embodiment, since the silicide conductive layer 48 is formed directly on the semiconductor layer 231, the silicide conductive layer 48 is electrically connected with the semiconductor layer 231 so that the selective gate transistor 23 can function as a single transistor. Then, the silicide conductive layer 48 can not be reacted with silicon any more at the annealing process for silicify the floating gate 123 in the memory cell transistor 12 because the silicide conductive layer 48 is already reacted with the silicon. As a result, there is not such a disadvantage as the area in the vicinity of the semiconductor substrate 11 is made of silicide to deteriorate some characteristics such as threshold value of the selective gate transistor 23.

The silicide conductive layer 48 can exhibit the inherent barrier performance to some degrees. As is apparent from FIG. 12, therefore, no barrier film made of titanium (Ti) or the like is required to be formed so that the manufacturing process of the nonvolatile semiconductor memory 40 can be simplified.

In this embodiment, the conductive layer 48 may be made of tungsten silicide (WSi), cobalt silicide (CoSi), titanium silicide ($TiSi_2$) and the like.

The nonvolatile semiconductor memory 40 can be manufactured in the same manner as the nonvolatile semiconductor memory 30 in the third embodiment except that the silicide conductive layer 48 is formed instead of the conductive layer 38 and whether the barrier layer 232 is formed or not.

The silicide conductive layer 48 may be formed by means of chemical vapor deposition (CVD) using (a) prescribed raw material gas(es). In the case of the formation of the WSi conductive layer 48, for example, a $WF_6$ raw material gas and a $SiH_2Cl_2$ (dichlorosilane) raw material gas are employed.

Although the present invention was described in detail with reference to the above examples, this invention is not limited to the above disclosure and every kind of variation and modification may be made without departing from the scope of the present invention.

What is claimed is:

1. A stacked gate nonvolatile semiconductor memory comprising at least a memory cell transistor and a selective gate transistor which are formed on a semiconductor substrate;
    the memory cell transistor including:
        a first floating gate made of a semiconductor material;
        a first interlayer insulating layer made of an insulating material above the first floating gate; and
        a first control gate made of a silicide material above the first interlayer insulating layer, and
    the selective gate transistor including:
        a second floating gate made of the semiconductor material;
        a second interlayer insulating layer made of the insulating material above the second floating gate;
        a second control gate made of the silicide material above the second interlayer insulating layer;
        a trench formed from a top of the second control gate into the second floating gate through the second interlayer insulating layer; and
        a conductive layer in the trench made of a conductive material not subject to silicide process, and electrically connecting the second floating gate and the second control gate.

2. The stacked gate nonvolatile semiconductor memory as set forth in claim 1,
    wherein said conductive layer is made of at least one selected from the group consisting of W, TiN, Al and Cu.

3. The stacked gate nonvolatile semiconductor memory as set forth in claim 1,
    further comprising a barrier film formed on an inner wall of the trench so as to separate said conductive layer from the second control gate.

* * * * *